United States Patent
Honma

[19]

[11] Patent Number: 5,923,220
[45] Date of Patent: Jul. 13, 1999

[54] CLOCK REPRODUCING DEVICE AND CLOCK REPRODUCING METHOD, WHICH UTILIZE A FREQUENCY DIFFERENCE AND RECEIVING INTERVAL

[75] Inventor: Hiroshi Honma, Tokyo, Japan

[73] Assignee: Mitsubishi Denki Kabushiki Kaisha, Tokyo, Japan

[21] Appl. No.: 08/771,932

[22] Filed: Dec. 23, 1996

[30] Foreign Application Priority Data

Mar. 7, 1996 [JP] Japan ................................ 8-050129

[51] Int. Cl.[6] .................................................. H03L 7/181
[52] U.S. Cl. ............................ 331/17; 331/25; 375/366; 375/376
[58] Field of Search ....................... 331/17, 25; 375/365, 375/366, 376

[56] References Cited

U.S. PATENT DOCUMENTS

| | | | |
|---|---|---|---|
| 4,935,707 | 6/1990 | Irwin | 331/17 |
| 4,972,160 | 11/1990 | Sylvain | 331/17 |
| 5,583,466 | 12/1996 | Jang | 331/17 |
| 5,699,392 | 12/1997 | Dokic | 375/376 |

OTHER PUBLICATIONS

"ITU–T Recommendation H.222.0 | ISO/IEC 13818–1— Information Technology—Generic Coding of Moving Pictures and Associated Audio Information: Systems", pp. 126–128, Aug. 8, 1994, Japan.

*Primary Examiner*—Siegfried H. Grimm

[57] ABSTRACT

The clock reproducing device includes a control device which generates a control signal for decreasing a clock frequency difference between a transmitter and a receiver according to a clock information difference between the transmitting clock information and reproduced clock information and a receiving interval of the transmitting clock information, thereby the clock reproducing device controls a reproduced clock frequency of a reproduced clock output device. The clock reproducing device carries out appropriate frequency control regardless of the transmitting interval of the transmitting clock information received from the transmitter.

14 Claims, 11 Drawing Sheets

CLOCK REPRODUCING DEVICE AND CLOCK REPRODUCING METHOD, WHICH UTILIZE A FREQUENCY DIFFERENCE AND RECEIVING INTERVAL

BACKGROUND OF THE INVENTION

1. Field of the Invention

The invention relates to a clock reproducing device and a clock reproducing method for reproducing a clock of a transmitting side using clock information transmitted from the transmitting side at a receiving side in a communication apparatus or a broadcasting apparatus.

2. Description of the Prior Art

FIG. 11 is a block diagram showing a conventional clock reproducing device disclosed, for example, on the Recommendation H.222. 0, pages 182–184 in ITU-T White Book, of Japanese version, which correspond to "pages 126–128 of English version" A Collection book of Recommendation on Audio Visual/Multimedia (H series), published on Feb. 18, 1995 by an incorporated foundation, Japan ITU Association. In FIG. 11, the clock reproducing device includes a voltage-controlled oscillator 11, a counter 12 operating by a reproduced clock outputted from the voltage-controlled oscillator 11, a clock difference detector 13, and a low-pass filter/gain device 14.

In the above mentioned Recommendation, the clock information transmitted from the transmitting side is referred to as a PCR (program clock reference), and the clock information reproduced on the receiving side is referred to as an STC (system time clock). The PCR is a count value of a counter operating by the clock used on the transmitting side. On the other hand, the STC is a count value 12 operating by the clock reproduced on the receiving side.

FIG. 11 also shows a difference 15 between the PCR and the STC calculated by the clock difference detector 13, a control voltage 16 outputted from the low-pass filter/gain device 14 to the voltage-controlled oscillator 11.

Usually, the receiving side's free-running system clock frequency will not match the transmitting side's clock frequency which is sampled and indicated in the SCR values. The receiving side's STC can be made to slave its timing to the transmitting side using the received SRCs. The conventional method of slaving the receiving side's clock to the received data stream is via a phase-locked loop (PLL). Variations of a basic PLL, or other methods, may be appropriate, depending on the specific application requirements. A straightforward PLL which recovers the STC on the receiving side is diagrammed and described in FIG. 11. FIG. 11 shows a classic PLL, except that the reference and feedback terms are numbers (STC and SCR or PCR values) instead of signal events such as edges.

Upon initial acquisition of a new time base, i.e., a new program, the STC is set to the current value encoded in the SCRs. Typically, the first SCR is loaded directly into the STC counter, and the PLL is subsequently operated as a closed loop. Variations on this method may be appropriate, i.e., if the values of the SCRs are suspect due to jitter or errors.

The closed loop action of the PLL is as follows. At the moment that each SCR (or PCR) arrives at the receiving side, that value is compared with the current value of the STC in the clock difference detector 13. The difference 15 is a number, which has one part in units of 90 kHz and one part in terms of 300 times this frequency, i.e., 27 MHz. The difference 15 is linearized to be in a single number space, typically units of 27 MHz, and is the error term in the loop. The sequence of error terms (which make up difference 15) is input to the low-pass filter and gain device 14, which are designed according to the requirements of the application. The output of device 14 is the control voltage 16 which controls the instantaneous frequency of the voltage controlled oscillator (VCO) 11. The output of the VCO 11 is an oscillator signal with a nominal frequency of 27 MHz; this signal is used as the system clock frequency on the receiving side. The 27 MHz clock is input to counter 12 which produces the current STC values, which consist of both a 27 MHz extension, produced by dividing by 300, and a 90 kHz base value which is derived by counting the 90 kHz results in a 33 bit counter. The 33 bit, 90 kHz portion of the STC output is used as needed for comparison with PTS and DTS values. The complete STC is also the feedback input 101 to the clock difference detector 13.

Next, an operation is explained below. In case of starting the reproduction of the transmitting clock at a receiver, the received transmitting clock information (PCR) 100 is first loaded in the counter 12. The counter 12 carries out counting using the reproduced clock outputted from the voltage-controlled oscillator 11.

When a second PCR 100 arrives, the reproduced clock information (STC) 101 which is an output of the counter 12 at this time is inputted into the clock difference detector 13, then, the difference 15 between the STC 101 and the secondly arrived PCR 100 is obtained.

Since the PCR 100 is a count value counted according to the clock of the transmitter and the STC is a count value counted according to the clock of the receiver, the difference between the PCR 100 and the STC 101 shows a value between a frequency of the clock of the transmitter and a frequency of the clock of the receiver.

In case that the clock frequency of the transmitter is higher than the clock frequency of the receiver by 20 Hz, an increase of a count value of the PCR 100 is larger than an increase of a count value of the STC 101 by 20 per second. On the other hand, if the difference 15 between the PCR 100 and the STC 101 becomes constant, it means that the frequencies of the transmitters and the receivers are the same.

If the difference 102 is constant every time the PCR 100 arrives, it means that increments of the both counters are the same, which also means the transmitting side frequency is the same as the reproduced frequency on the receiving side.

The difference 15 outputted from the clock difference detector 13 is converted to a control voltage by the low-pass filter/gain device 14, and outputted to the voltage-controlled oscillator 11. If the differential value is higher at a certain time, it increases the control voltage 16, and then the output frequency of the voltage-controlled oscillator 11 increases. Therefore, the output of the counter 12 increases, which causes the difference between the PCR 100 and the STC 101 to decrease gradually.

The above mentioned operation is repeated for every time when the PCR 100 arrives, and the frequency of the voltage-controlled oscillator 11 is controlled so that an output of the clock difference detector 13, i.e difference between the PCR 100 and the STC 101, is constant. In other words, the value counted up per a time on the reproducing side gradually becomes the same as that on the transmitting side, which means that the clock frequency on the reproducing side becomes the same clock frequency as on the transmitting side.

In a stable state in which the receiving side clock frequency is reproduced the same as that on the transmitting side, the difference between the PCR 100 and the STC 101 is generally kept to be a constant value (off-set). Though no off-set exists at first since the PCR 100 is loaded in the counter 12 at the beginning, the transmitting side frequency is different from the reproduced frequency because the transmitting side frequency is not reproduced yet at the receiving side. Then, the count value 12 gradually shifts away from the PCR 100 until the reproducing operation starts. But, after the reproducing operation starts, the reproduced frequency is controlled so that the difference is kept constant. Therefore, the off-set is kept even in the stable state.

As mentioned above, in the conventional clock reproducing device, the difference between the transmitting clock information (PCR) and the reproduced clock information (STC) is used as information which simply indicates a difference between the frequencies on the transmitting side and the receiving side. That is, the conventional clock reproducing device controls the reproduced frequency by the above difference value inputted into the low-pass filter/gain device 14. Therefore, the low-pass filter/gain device 14 is controlled by the inputted difference to output the constant control voltage if the difference is constant, regardless of the receiving interval of the transmitting clock information.

The difference between the transmitting clock information and the reproduced clock information is proportional to the receiving interval of the transmitting clock information. Therefore, even if the frequency difference is constant, the outputted difference can be different depending on the length of the transmitting intervals of the transmitting clock information. Accordingly, even if the length of the transmitting intervals of the transmitting clock information is different, it is necessary to output the constant control voltage to the oscillator to decrease the constant frequency difference. Therefore, the same low-pass filter/gain device 14 can not be used if the transmitting intervals of the transmitting clock information is different. Accordingly, it is necessary to take proper steps according to the transmitting intervals of the transmitting clock information.

Furthermore, in case that the voltage-controlled oscillator is used, a practical relation of the output frequency versus the control voltage often differs from that shown in a catalog. Consequently, it is necessary to adjust the above relation of the output frequency versus the control voltage by measuring the actual characteristics of the control voltage and the output frequency of the voltage-controlled oscillator every time a system is constructed.

In the conventional clock reproducing device, the difference is controlled to be constant since the constant difference between the transmitting clock information and the reproduced clock information means that the frequency of transmission clock is the same as that of reception clock. Still, the difference between the PCR and the STC includes the off-set as mentioned above. Therefore, in a receiver which processes the data by synchronizing the value of the transmitting clock information with the value of the reproduced clock information, if the difference between the received transmitting clock information and the reproduced clock information is large, it is necessary to store the data for the time corresponding to the difference into the receiver, which requires a buffer large enough to absorb the difference. Consequently, it is necessary to design according to the quantity of the differential value, and therefore the cost increases because of an increase of hardware such as the buffer. Furthermore, the count value becomes discontinuous when the count value is loaded or reset after the start of the reception procession, which disturbs the operation of the data processing apparatus.

It is an object of the present invention to solve the above mentioned problems, and to provide a clock reproducing device and a clock reproducing method appropriately controlled regardless of the transmitting interval of the transmitting clock information. Where, the "transmitting interval" means an interval in which a clock information is outputted at the transmitting side. On the other hand, a "receiving interval" of the transmitting clock information means an interval in which a clock information is received at the receiving side. In general, the "transmitting interval" of the transmitting clock information and the "receiving interval" of the transmitting clock information are substantially the same. However, in some cases, they are different if the transmitting clock and the receiving clock are different.

It is another object of the present invention to provide a clock reproducing device and the clock reproducing method which are not necessary to be adjusted according to the dispersion of the characteristic of the control voltage and the dispersion of the output frequency of the oscillator.

It is further object of the present invention to provide a clock reproducing device and the clock reproducing method in which the receiver design is facilitated by minimizing the difference between the received transmitting clock information and the reproduced clock information.

SUMMARY OF THE INVENTION

According to one aspect of the invention, a clock reproducing device comprises a reproduced clock output means for outputting a reproduced clock information; a clock difference detecting means for detecting a difference between transmitting clock information received from a transmitting side and reproduced clock information indicating a reproduced clock frequency outputted from the reproduced clock output means; a receiving interval output means for detecting and outputting a receiving interval of the transmitting clock information; and a control means for controlling the reproduced clock frequency of the reproduced clock output means according to the receiving interval from the receiving interval output means and the difference from the clock difference detecting means.

According to another aspect of the invention, the receiving interval output means of the clock reproducing device comprises detecting means for detecting each interval of a plurality of the transmitting clock information; a receiving interval setting means for setting a desired receiving interval threshold value; and an output means for outputting receiving interval information according to a comparison result between the receiving interval threshold value set by the receiving interval setting means and the receiving interval detected by the detecting means.

According to further aspect of the invention, the receiving interval setting means of the clock reproducing device sets the receiving interval threshold value according to the difference obtained by the clock difference detecting means.

According to further aspect of the invention, the control means of the clock reproducing device sets a control variable range of the reproduced clock frequency outputted from the reproduced clock output means according to the difference obtained by the clock difference detecting means.

According to further aspect of the invention, the control means calculates a frequency difference between the transmitting side clock frequency and the reproduced clock frequency according to the receiving interval information from the receiving interval output means and the difference information from the clock difference detecting means, generates a control signal for controlling the reproduced clock frequency outputted from the reproduced clock output means according to the frequency difference, and corrects the generated control signal according to the frequency difference obtained at a plurality of different timings.

According to further aspect of the invention, the control means calculates the frequency difference between the transmitting side clock frequency and the reproduced clock frequency according to the receiving interval information from the receiving interval output means and the difference from the clock difference detecting means, and controls the reproduced clock frequency outputted from the reproduced clock output means by a larger control range than the frequency difference.

According to further aspect of the invention, a clock reproducing method comprises the steps of: detecting a receiving interval of transmitting clock information indicating a transmitting side clock frequency; detecting a difference between the received transmitting clock information and a reception clock information indicating a reproduced clock frequency; and controlling the reproduced clock frequency according to the detected difference and the receiving interval.

According to further aspect of the invention, the clock reproducing method further comprises the steps of: setting a desired receiving interval threshold value; and calculating a receiving interval information according to a comparison result between the receiving interval threshold value and the detected receiving interval.

According to further aspect of the invention, the clock reproducing method further comprises the step of: setting the receiving interval threshold value according to the difference between the received transmitting clock information and the reception clock information.

According to further aspect of the invention, the clock reproducing method further comprises the step of: setting the control variable range and controlling the reproduced clock frequency are carried out according to the difference between the received transmitting clock information and the reception clock information.

According to further aspect of the invention, the clock reproducing method further comprises the steps of: calculating a frequency difference between the transmitting side clock frequency and the reproduced clock frequency according to the receiving interval and the difference; generating control information for controlling the reproduced clock frequency according to the frequency difference; and correcting the generated control signal according to the frequency difference obtained at a plurality of different timings.

According to further aspect of the invention, the clock reproducing method further comprises the steps of: calculating the frequency difference between the transmitting side clock frequency and the reproduced clock frequency according to the receiving interval information and the difference; and controlling the reproduced clock frequency by a larger control range than the frequency difference.

BREEF DESCRIPTION OF THE DRAWINGS

The present invention will become more fully understood from the detailed description given herein below and the accompanying drawings which are given by way of illustration only, and thus are not limitative of the present invention, and wherein.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Embodiment 1

Figure 1:
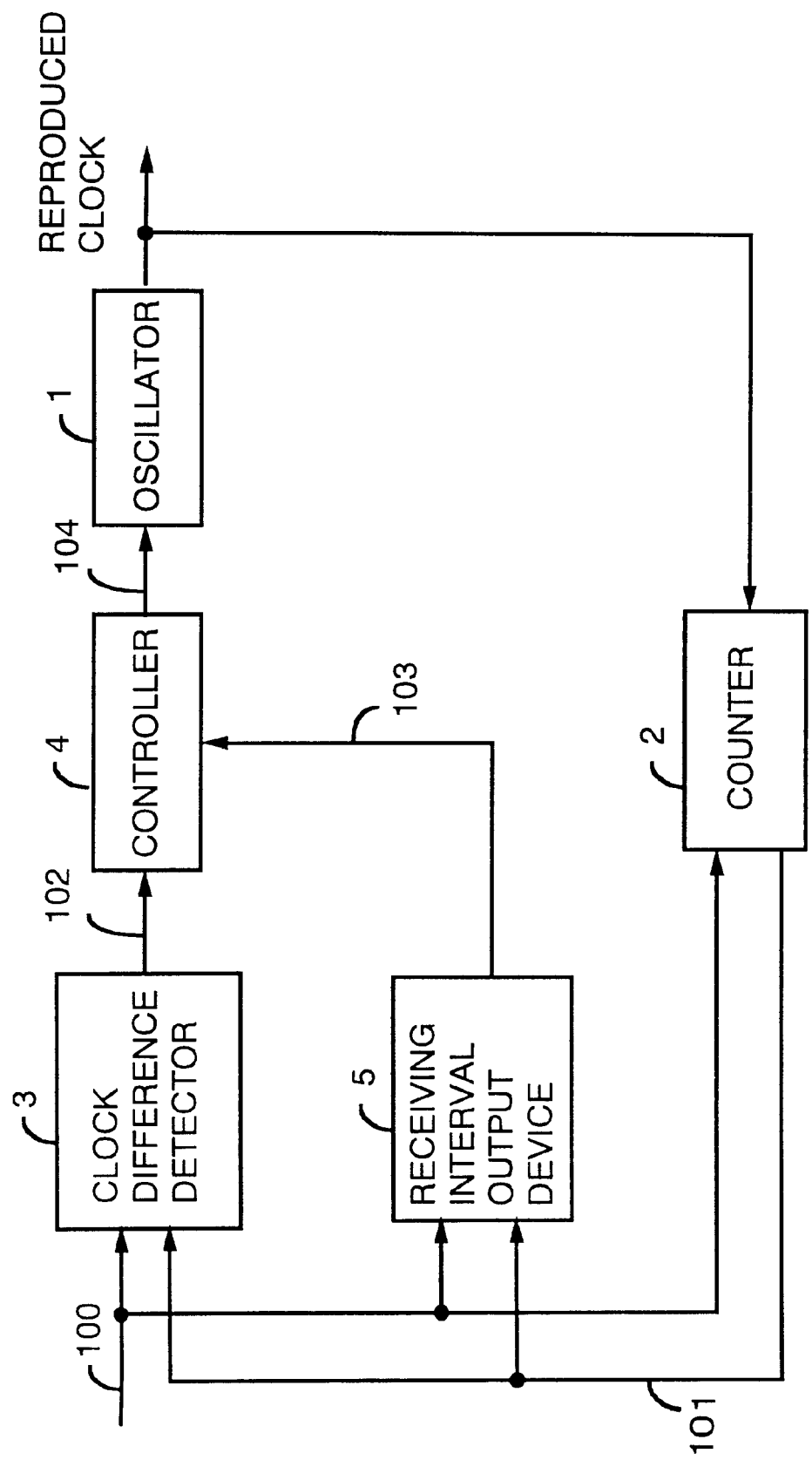
FIG. 1 is a block diagram of a clock reproducing device of a first embodiment of the present invention.

FIG. 1 is a block diagram showing a clock reproducing device of a first embodiment of the present invention. In FIG. 1, the clock reproducing device includes an oscillator 1 for outputting a reproduced clock, and a counter 2 for operating according to the reproduced clock from the oscillator 1 and outputting the resultant count value as reproduced clock information 101. This reproduced clock information 101 shows a frequency of a reproduced clock of the oscillator 1, and also shows a time passage of the clock reproducing device.

A clock difference detector 3 receives transmitting clock information 100, detects a difference between the received transmitting clock information 100 and the reproduced clock information 101 outputted from the counter 2, then outputs the difference as a clock information difference 102.

A controller 4 outputs a control signal 104 which controls a reproduced clock frequency of the oscillator 1 according to the clock information difference 102 from the clock difference detector 3. A receiving interval output device 5 detects an interval which is a period that the clock difference detector 3 receives the transmitting clock information 100, and outputs a receiving interval information 103 to the controller 4 according to the detected interval.

Next, an operation is explained. In order to start clock reproduction in the clock reproducing device, the transmitting clock information 100 inputted into the clock difference detector 3 at first is loaded into the counter 2. The arrival of the transmitting clock information 100 is known by detecting a flag inserted at a predetermined bit of a time series in the signal in which the transmitting clock information 100 is transmitted, or is known by a dedicated signal line (not shown) indicating the arrival.

The value loaded into counter 2 is outputted to the receiving interval output device 5 as a reproduced clock information 101 (at this point, the reproduced clock information is equal to the transmitting clock information) and held in the receiving interval output device 5. The loaded counter value from the counter 2 is output to the clock difference detector 3. The counter 2 again starts to count the reproduced clock from the oscillator 1.

When the second transmitting clock information 100 arrives, the clock difference detector 3 calculates the difference according to the transmitting clock information 100 and the reproduced clock information 101 from the counter 2, then outputs the clock information difference 102 as a difference between information showing clock frequencies on the transmitting side and the reproducing side.

On the other hand, the counted-up reproduced clock information 101 until this time is also inputted into the receiving interval output device 5. This reproduced clock information 101 inputted into the receiving interval output device 5 indicates time passing in this device. The receiving interval output device 5 calculates the difference from the reproduced clock information 101 which is stored in the receiving interval output device 5 when the first transmitting clock information 100 arrives, and the reproduced clock information 101 which is inputted at present time to obtain a receiving interval of the reproduced clock information 101.

The above calculated receiving interval is outputted to the controller 4 as the receiving interval information 103. Alternatively, the receiving interval output means 5 holds the reproduced clock information 101 inputted at this time.

When the receiving interval information 103 is inputted from the receiving interval output device 5 into the controller 4, the controller 4 calculates a difference ($\Delta f$), which is used as a reference signal to control the reproduced clock frequency of the oscillator 1, according to the receiving interval information 103 and the clock information difference 102 from the clock difference detector 3. The arrival of the receiving interval information 103 is known by detecting a flag inserted at a predetermined bit of a time series in the signal in which the receiving interval information 103 is transmitted, or is known by the dedicated signal line (not shown) indicating the arrival.

The controller 4 holds the clock information difference 102. A formula (1) shows how to calculate the frequency difference $\Delta f$.

$$\Delta f_k = (\text{clock difference information }_k - \text{clock difference information } k_{-1}) \times \text{receiving interval }_k / f \quad (1)$$

where, $\Delta f_k$: a frequency difference when receiving k-th transmitting clock information f: a reference clock frequency clock difference information $_k$: k-th clock difference information receiving interval $_k$: a k-th receiving interval The receiving interval information 103 can be calculated by dividing the receiving interval by the reference clock frequency f. For example, since the frequency f indicates the number of the clock per one second, if the clock having the frequency of f (=$10^6$ Hz) enters into the counter, the counter value of the counter increases $10^6$ for one second. Therefore, when the receiving interval (count value) equals $10^5$, the receiving interval time is 0.1 sec (100 msec), which is obtained by dividing the receiving interval of $10^5$ by the clock frequency of $10^6$.

The controller 4 outputs the control signal 104 so that the clock frequency outputted from the oscillator 1 changes by the frequency difference $\Delta f$ which is obtained by the formula (1). In the oscillator 1, the frequency of the output clock changes according to the control signal 104, and as a result, the frequency difference $\Delta f$ decreases (with an ideal operation, $\Delta f$ becomes "0" by only one control).

In case that a voltage-controlled oscillator is used as the oscillator 1, the frequency $\Delta f$ is controlled by changing the voltage of the control signal 104. In case that a frequency synthesizer is used as the oscillator 1, the frequency $\Delta f$ is controlled by changing a generated frequency value. If the frequency difference $\Delta f$ is not equal to "0", the operation mentioned above is repeated until the frequency difference $\Delta f$ becomes "0".

If the frequency difference $\Delta f$ is equal to "0", it means that the former clock difference information is equal to the present clock difference information. In other words, it means that the difference between the transmitting clock information 100 and the reproducing cock information 101 is constant, and that the frequency counted in the same period is constant. At this point, the clock frequency used in the transmitter is completely reproduced. The fact that the frequency difference $\Delta f = $ "0" does not mean that the clock information difference 102 itself is equal to "0".

As explained above, even if the transmitting interval of the transmitting clock information is not periodical, or each transmitting interval is different for every transmitter, it is always possible to provide an appropriate control.

An example for obtaining the frequency difference $\Delta f$ and generating the control signal 104 according to the frequency difference $\Delta f$ is shown above. However, it is also possible to directly generate the control signal of the reproduced clock frequency of the oscillator 1 according to the receiving interval information 103 and the clock information difference 102 from the clock difference detector 3 without computing the frequency difference $\Delta f$.

In this embodiment, the count value of the counter 2 is used as information to detect the receiving interval. However, it is also possible to have a timer in the receiving interval output device 5 and to use the time information of the timer for example.

Furthermore, in this embodiment, the transmitting clock reception device is comprised of the clock difference detector 3, but it is also possible to have a transmitting clock reception device separately.

Figure 2:
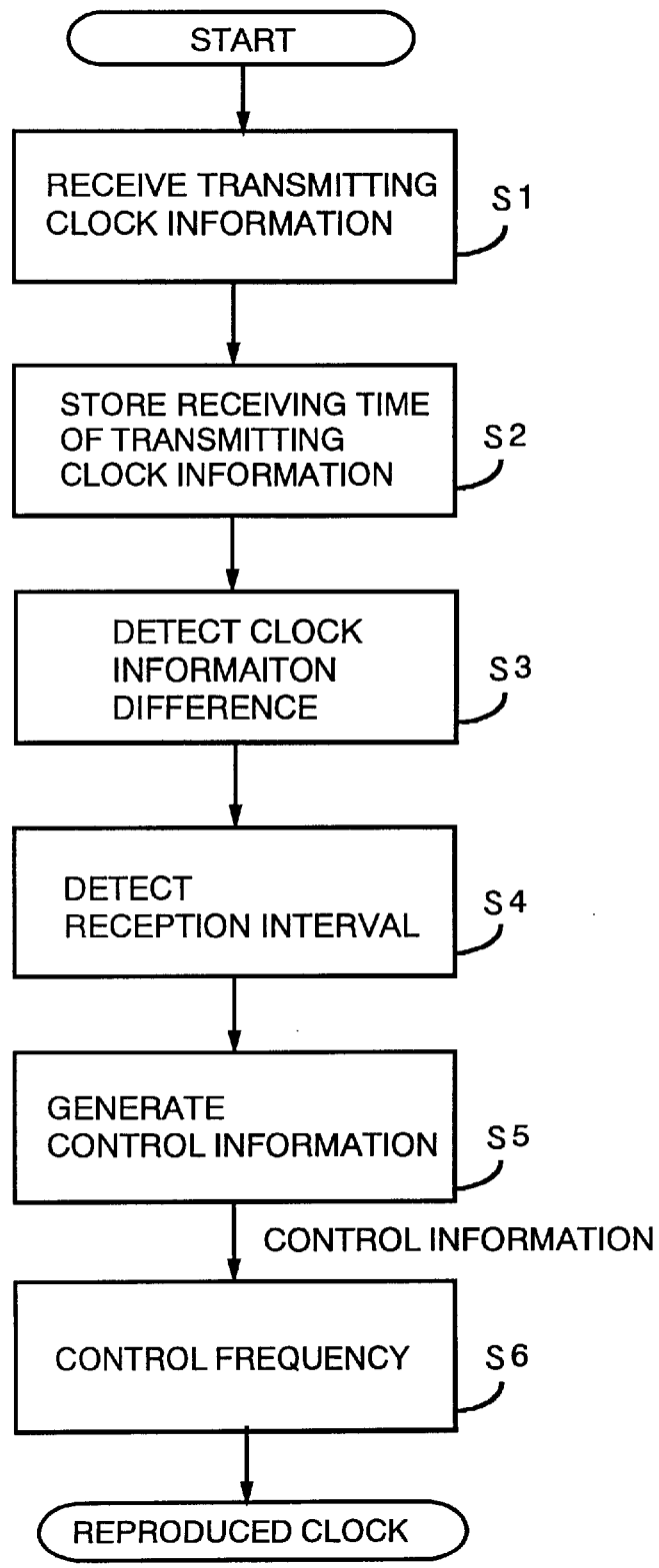
FIG. 2 is a flow chart showing a clock reproducing operation of the first embodiment of the present invention.

In case of reproducing the clock signal, it is also possible to generate the whole or part of the control signal outputted to the oscillator 1 by software. FIG. 2 is a flow chart to show a such case.

Next, the flow chart of FIG. 2 is explained below. In a step S1, the transmitting clock information is received. The transmitting clock information received at first is loaded into the counter operated by the reproduced clock.

In a step S2, a time when the transmitting clock information is received in the step S1 is stored.

In step S3, the clock information difference (the transmitting clock information—reproduced clock information) is detected and stored according to the received transmitting clock information and the value (reproduced clock information) of the counter operating by the reproduced clock.

In step S4, the receiving interval is detected according to the time stored when the preceding transmitting clock information is received and the time when the transmitting clock information is received at present. These times can be calculated by either using the time of the timer or using the above reproduced clock information as time information (the reproduced clock information at present—the preceding reproduced clock information).

In step S5, the control information is generated and outputted so that the frequency difference between the clocks on the transmitting side and the reproducing side becomes "0", according to the clock information difference calculated and stored in the preceding step S3 and the receiving interval obtained in the step S4. It is also possible to calculate the frequency difference Δf of formula (1) and obtain the control information according to the frequency difference Δf as introduced in the operation explanation of the controller 4 in FIG. 1.

Then, in a step S6, the reproduced clock frequency is controlled by the control information obtained in the step S5. These operations are repeated for every time when the transmitting clock information is received to reproduce the clock.

Embodiment 2

In a clock reproduction in the present invention, a detection accuracy of a transmitting clock frequency calculated on a reproducing side is proportional to a receiving interval time. Therefore, high detection accuracy can not be expected if the receiving interval is too short. In this second embodiment, a detection accuracy is improved so that a clock reproduction can be carried out by the detection accuracy of frequency required in various systems.

A relationship between the receiving interval and the detection accuracy is explained below.

In the formula (1), the frequency difference Δf is obtained as follows in case that the receiving interval time is 100 msec.

$$\Delta f = (\text{clock difference information}_k - \text{clock difference information}_{k-1}) \times 10$$

Therefore, the frequency difference Δf is obtained in 10 Hz unit.

In case that the receiving interval time is 1 sec, the frequency difference Δf is obtained as follows.

Δf=(clock difference information$_k$-clock difference information$_{k-1}$)×1

Therefore, the frequency difference Δf is obtained in 1 Hz unit.

Accordingly, it is possible to increase the detection accuracy, by carrying out the reproduced clock control after a desired receiving interval has passed, but not carrying out the reproduced clock control immediately after receiving the transmitting clock information 100.

Figure 3:
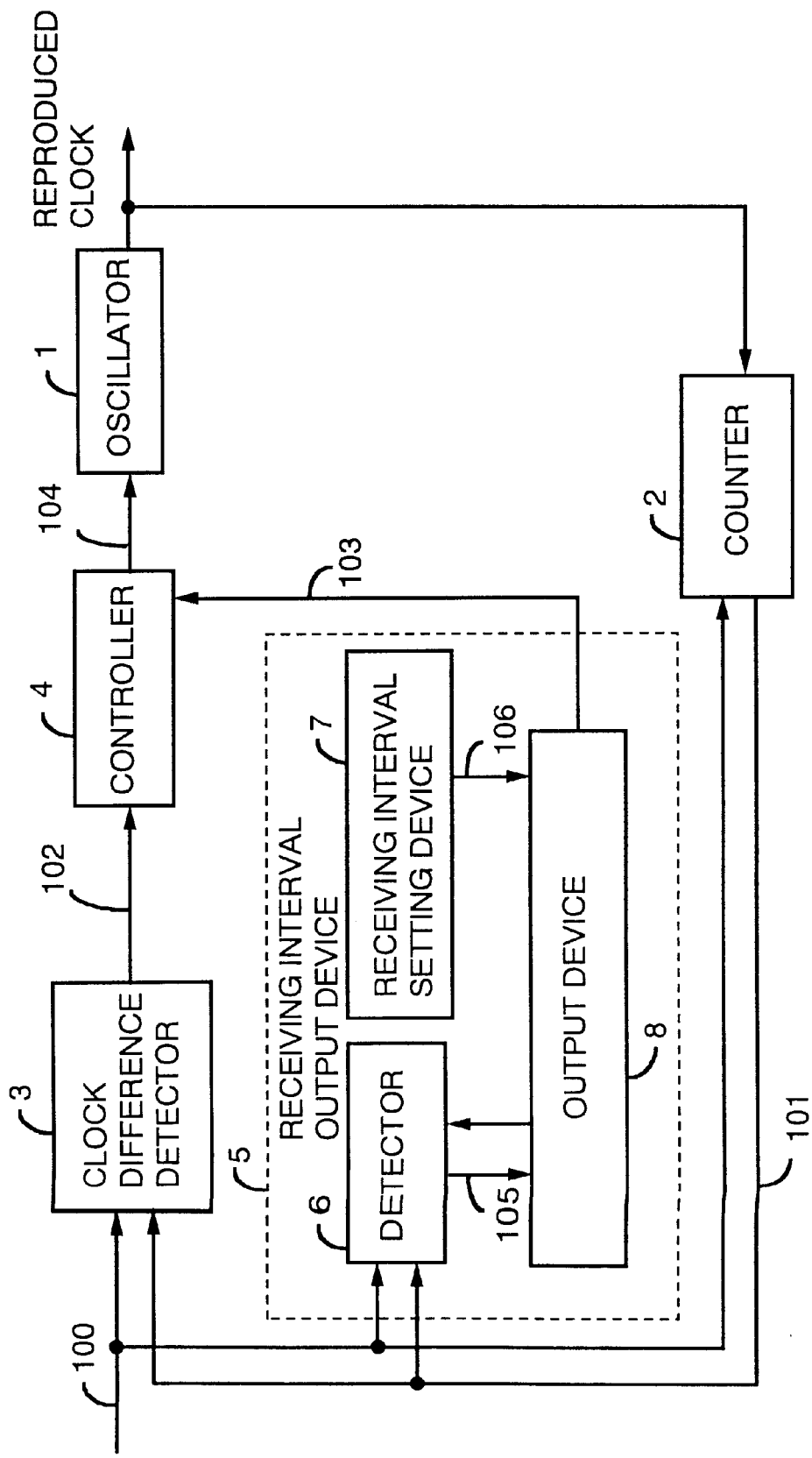
FIG. 3 is a block diagram of a clock reproducing device of a second embodiment of the present invention.

FIG. 3 is a block diagram showing a clock reproducing device of a second embodiment. Elements 1–4 are the same as those in the first embodiment. In FIG. 3, the clock reproducing device includes a receiving interval output device 5, a detector 6 for detecting an interval in which the clock difference detector 3 receives a plurality of transmitting clock information 100. The receiving interval output device 5 includes a receiving interval setting means 7 for setting a desired receiving interval threshold value, and an output device 8 for obtaining a receiving interval information 103 and outputting the receiving interval information 103 to the controller 4 according to a comparison result between a set receiving interval 106 set by the receiving interval setting means 7 and a detected receiving interval 105 detected by the detector 6.

Operation of the clock reproducing device of the second embodiment is explained below. The set receiving interval 106 is set in the receiving interval setting device 7 in advance. The detector 6 detects the receiving interval according to reproduced clock information 101 every time when the transmitting clock information 100 is received as explained in the first embodiment. The detector 6 then outputs the receiving interval to the output device 8 as the detected receiving interval 105.

The output device 8 compares the detected receiving interval 105 with the set receiving interval 106. In case that the detected receiving interval 105 is larger than the set receiving interval 106, which means that the detected receiving interval is large enough to obtain the set receiving interval which is set to obtain the desired detection accuracy, the detected receiving interval 105 is outputted to the controller 4 as the receiving interval information 103. Further, the detector 6 holds the reproduced clock information 101 (reception time information) at the time.

The receiving interval information 103 is inputted into the controller 4 which causes the controller 4 to calculate the frequency difference Δf according to clock information difference 102 and the receiving interval information 103, and to output a control signal 104 to control the oscillator 1 in the same way as in the first embodiment.

On the other hand, in case that the detected receiving interval 105 is smaller than the set receiving interval 106, which means that the detected receiving interval does not satisfy the predetermined receiving interval for obtaining the desired detection accuracy, the output device 8 does not output the receiving interval information 103. Further, the detector 6 detects the result, and discards the reproduced clock information 101 at the time. Therefore, the detector 6 detects the interval according to the reproduced clock information 101 (reception time information) received before and the reproduced clock information 101 inputted at this time, but not the interval according to the immediately preceding reproduced clock information 101 and the reproduced clock information 101 inputted at this time. These operations are repeated until the detected receiving interval 105 becomes larger than the set receiving interval 106.

When the above mentioned operations are completed, the clock reproduction are carried out by the desired detection accuracy.

Figure 4:
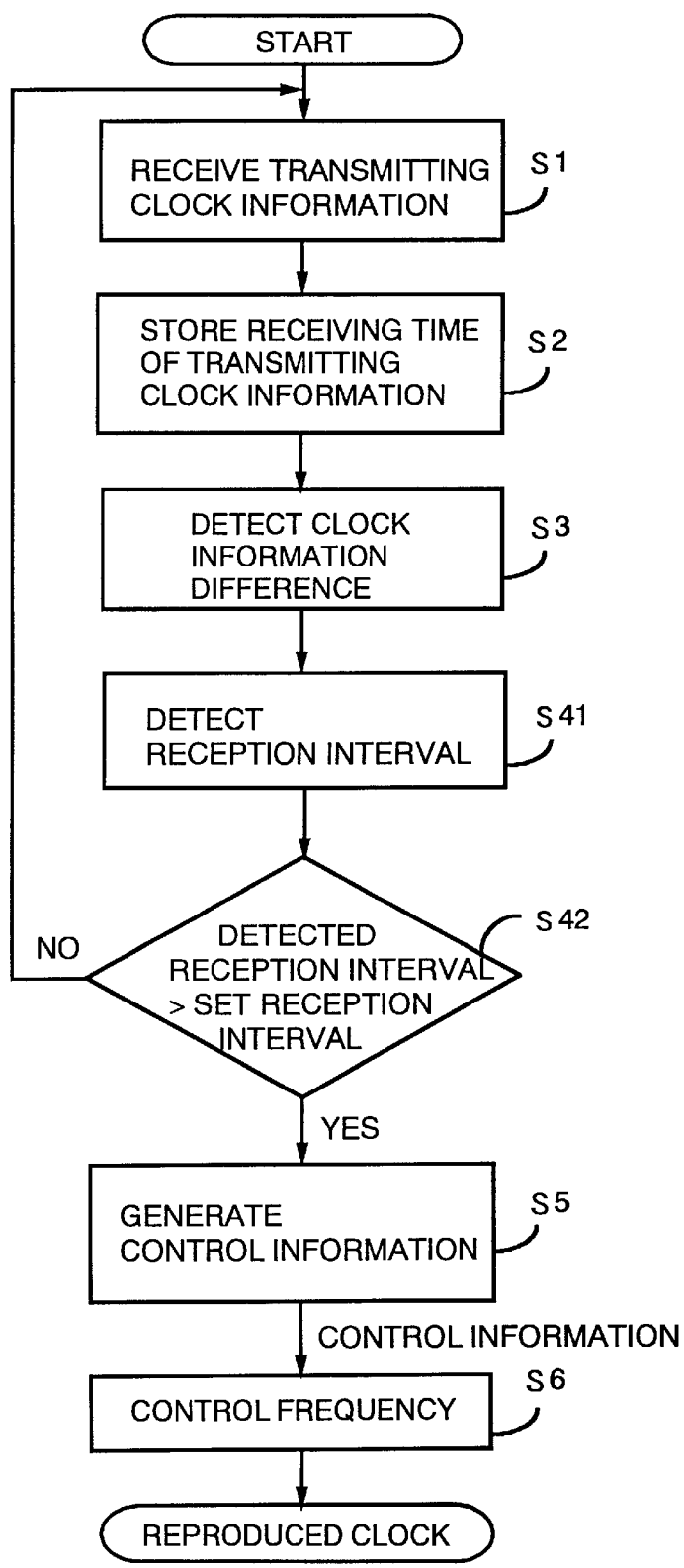
FIG. 4 is a flow chart of a clock reproducing operation of the second embodiment of the present invention.

FIG. 4 is a flow chart showing these operations of the second embodiment. FIG. 4 differs from FIG. 2 of the first embodiment in that FIG. 4 has steps S41 and S42 instead of the step S4 shown in FIG. 2.

In the step S41, the detected receiving interval is detected in the step S41, then in the step 42, it is judged whether the detected receiving interval is larger than the set receiving interval. If the result is YES, the control information signal is generated using the detected receiving interval. If the result is NO, the state returns to the step S1.

Embodiment 3

In the second embodiment, the receiving interval is kept to be the predetermined value to increase the detection accuracy. In the above case, however, although the receiving interval is long enough to increase the detection accuracy of the transmitting clock information, an accessing time for the oscillator 1 decreases. As a result, it takes longer time to stabilize the clock reproduction.

In a third embodiment, the time for stabilizing the clock reproduction is shortened, and at the same time, the high detection accuracy after the stabilization is obtained by dynamically varying the set receiving interval.

Figure 5:
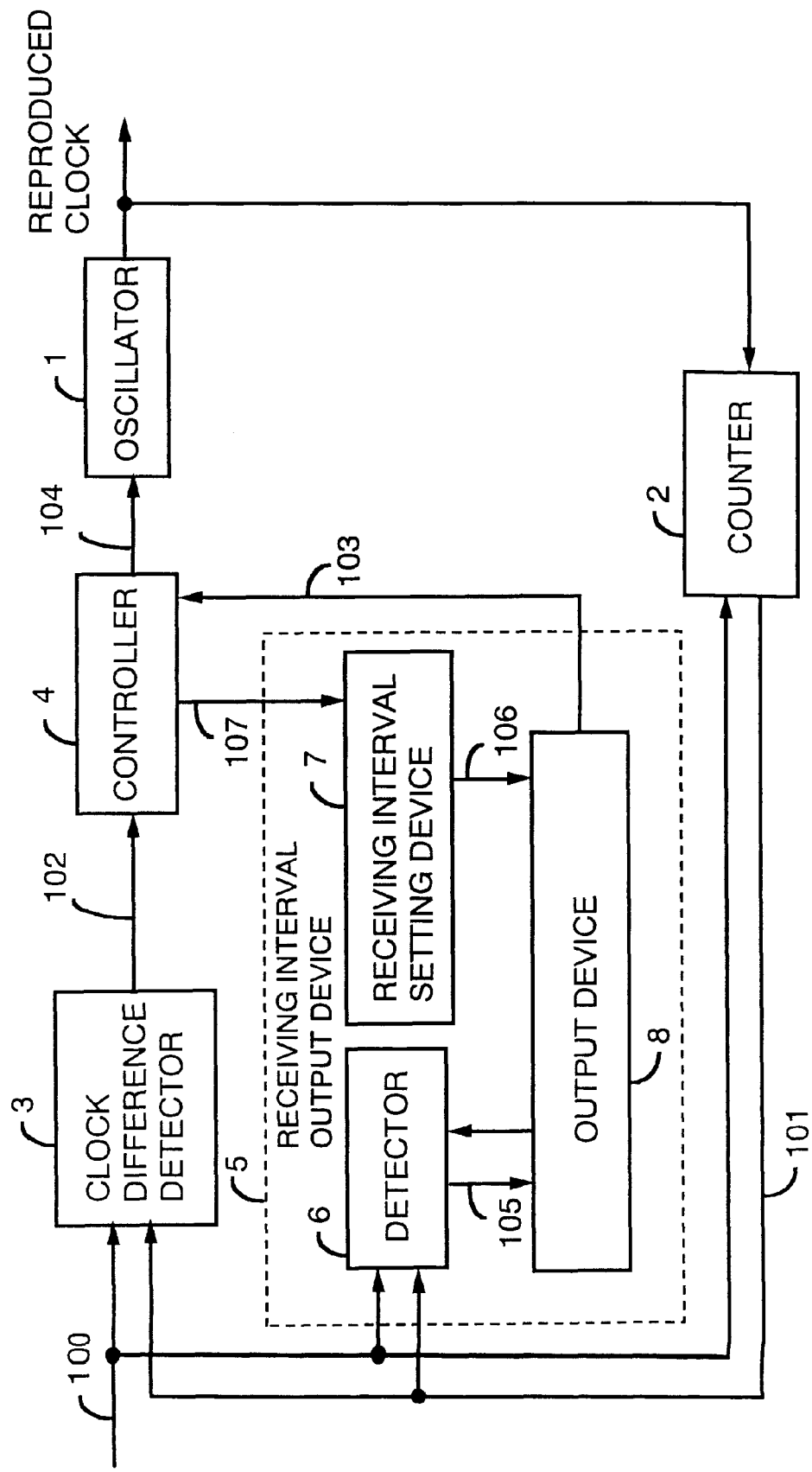
FIG. 5 is a block diagram of a clock reproducing device of a third embodiment of the present invention.

FIG. 5 is a block diagram showing a clock reproducing device of the third embodiment of the present invention. Elements 1–6 and 8 are the same as those shown in the second embodiment of FIG. 3. A receiving interval setting device 7 sets a set receiving interval according to a frequency difference (Δf) 107 obtained by the controller 4.

Operation of the third embodiment is explained below. A basic operation is the same as that in the second embodiment. However, the receiving interval setting device 7 sets the set receiving interval according to the frequency difference 107 obtained by the controller 4, and outputs the set receiving interval to the output device 8. When the frequency difference Δf is large, the set receiving interval 106 is decreased in order to increase the frequencies for controlling the oscillator, which quickens decrease of the frequency difference Δf. If the set receiving interval 106 is small, the set receiving interval 106 is increased in order to decrease the frequencies for controlling the oscillator. In this way, the time for stabilizing the clock reproduction is shortened, and at the same time, the high detection accuracy of the frequency is obtained.

Figure 6:
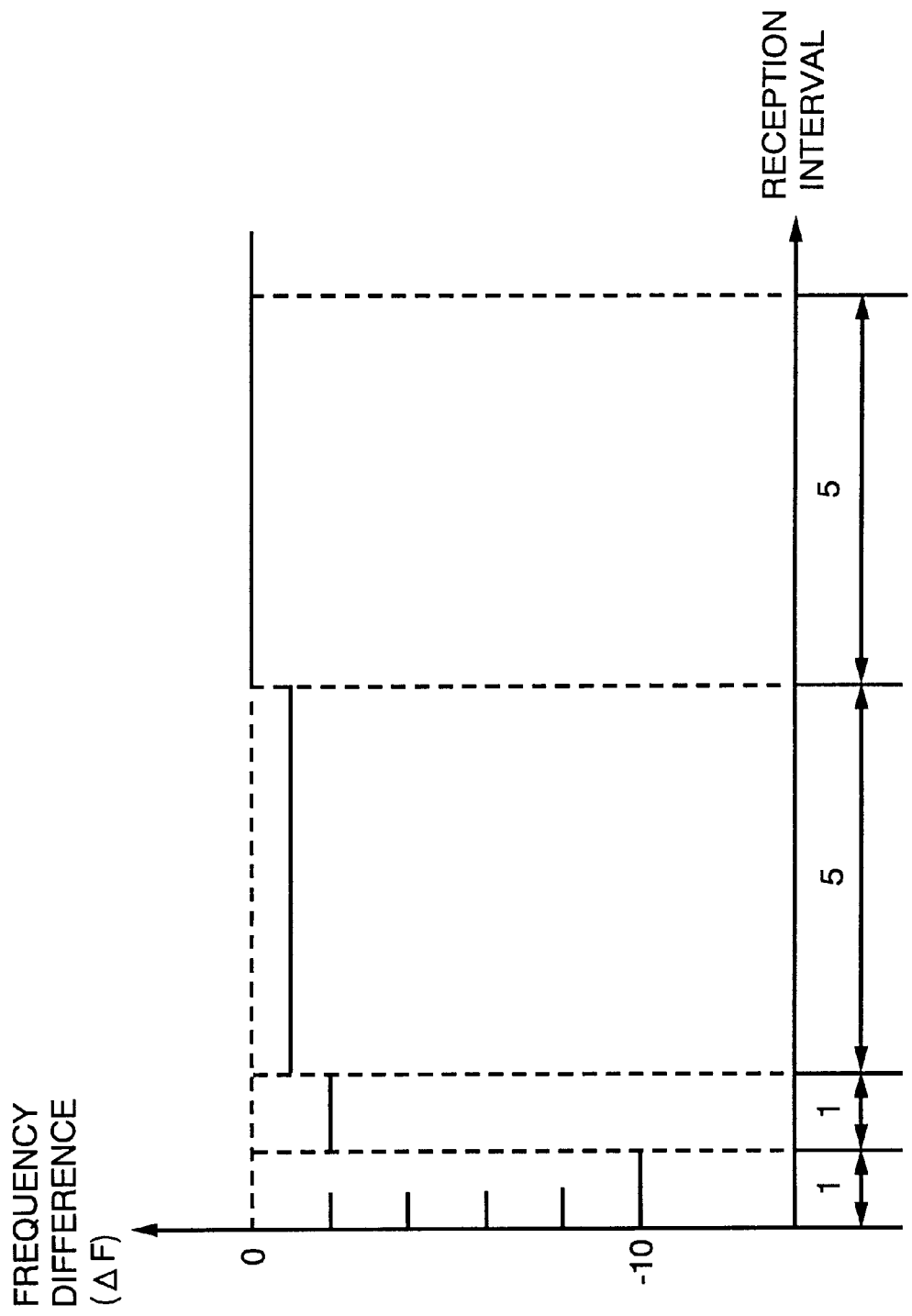
FIG. 6 is a diagram to explain an example of a frequency control of the third embodiment of the present invention.

FIG. 6 shows an operation example in this third embodiment. Soon after starting the clock reproduction, the frequency difference Δf is "−10", and the set receiving interval is "1".

A first control is carried out under the condition of the receiving interval of "1". At this time, the frequency difference Δf is calculated as "8", and the control is carried out so that this frequency difference is revised. Therefore, after this control, the frequency difference Δf becomes "2". Since the calculated frequency difference Δf is as large as "8" at this point, the receiving interval is not changed.

Next, for the second time, the control is carried out under the condition of receiving interval of "1" which is not changed. The frequency difference Δf is calculated as "1", then, the control is carried out so that this frequency difference is revised. Therefore, after the second control, the frequency difference Δf becomes "1". Since the calculated frequency difference Δf is as small as "1", the receiving interval is changed to "5".

For the third time, the control is carried out under the condition of the changed receiving interval of "5". The frequency difference Δf is calculated as "1". Since the frequency difference Δf is not changed at this time, the receiving interval is not changed. For the fourth time, under the condition of the receiving interval "5", the frequency difference Δf is calculated as "0". Since the frequency difference Δf is "0", a clock frequency of a transmitter is finally reproduced.

Embodiment 4

In general in a communication systems, a variable range of an operating frequency or a frequency range (frequency drift) where the variation is allowed within a certain time is specified.

In the above mentioned Recommendation H. 222. 0 in ITU-T, for example, the frequency of an oscillator 1 is specified as 27 MHz±30 ppm, and the frequency drift is specified as $75 \times 10^{-3}$ Hz/sec.

According to the above mentioned recommendation, $1/(75 \times 10^{-3}) = 13.3$ sec is necessary for changing the frequency by 1 Hz. Therefore, it is not appropriate to follow this recommendation at the beginning of the clock reproduction, since the clock reproduction takes a lot of time. In this fourth embodiment, the clock reproduction is quickly stabilized after the clock reproduction starts, then once the clock reproduction is stabilized, the variable range of a control signal 104 is limited within the range of the above mentioned frequency drift, and the clock reproduction is continued.

Figure 7:
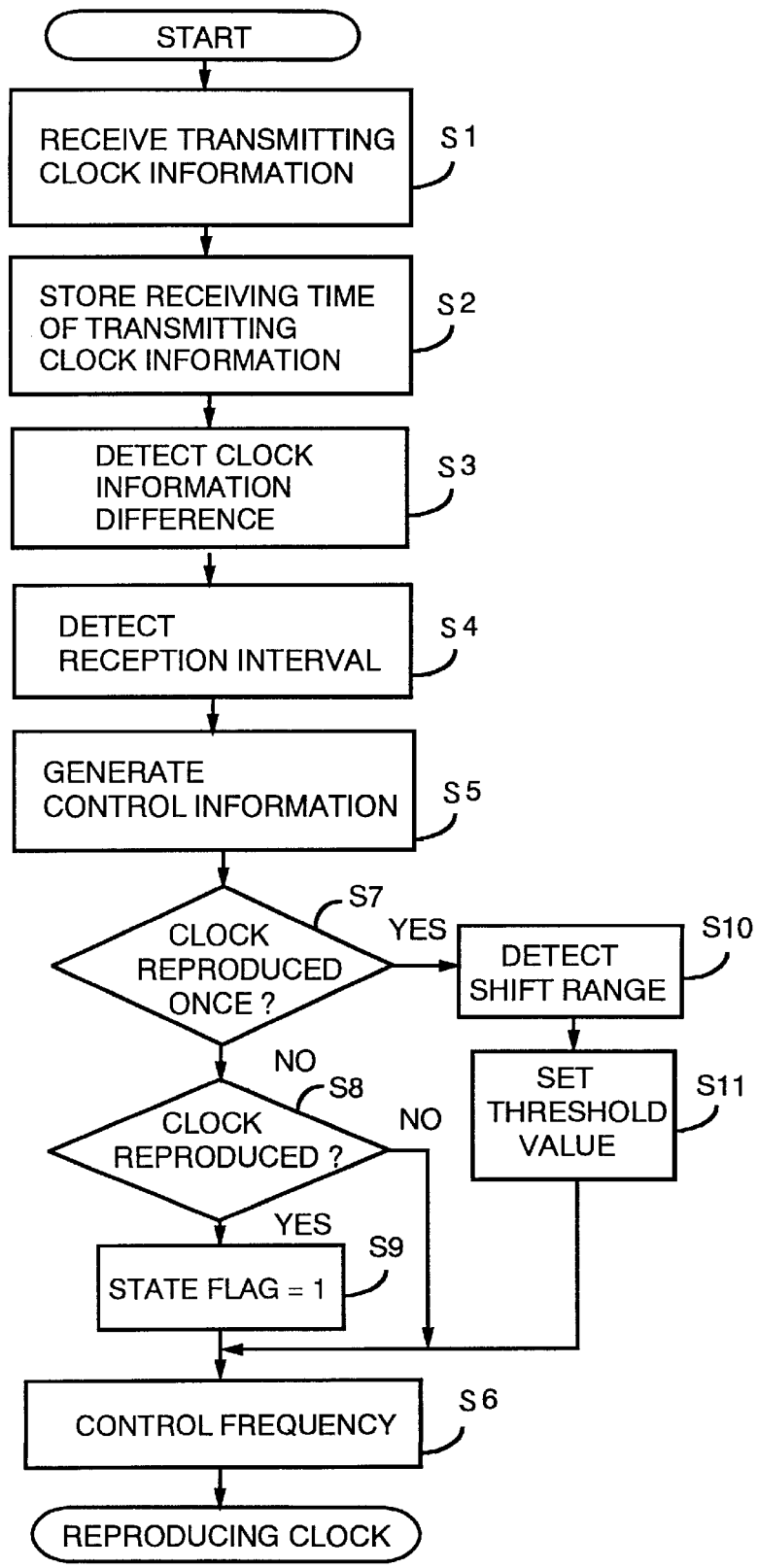
FIG. 7 is a flow chart showing a clock reproducing operation of a fourth embodiment of the present invention.

A block diagram of a clock reproducing device of a fourth embodiment is the same as those shown in the first to third embodiments. The control signal 104 is however generated in a different way in the controller 4, which is explained below using a flow chart of FIG. 7.

Steps S1–S5 and S6 are the same as those shown in the first embodiment of the flow chart of FIG. 2. In a step S7, it is judged whether the clock reproduction is already carried out once or the clock is being pulled according to a judging flag which is mentioned later.

If no clock reproduction is carried out, in other words, if a first clock is being pulled, the state goes to a step S8 where it is judged whether the clock reproduction is carried out or not. That is, according to an n-th clock information difference (n-th transmitting clock information—n-th reproduced clock information) obtained in a step S3 and a stored preceding ((n−1)-th) clock in formation difference, it is judged whether the clock reproduction is carried out, i.e. whether the (n−1)-th clock information difference is equal to the n-th clock information difference. As explained in step S5 of a flow chart of the first embodiment, in case that a frequency difference Δf is calculated in a step S5, it is possible to judge whether the clock reproduction is carried out (Δf="0") using the frequency difference Δf.

In case that it is judged the clock reproduction is carried out in step S8, then a state flag is changed to "1" in step S9. Then, the state goes to step 6, and a reproduced clock frequency is controlled using control information itself obtained in step S5. In this way, the frequency is controlled for a wider range, and the clock is is pulled faster.

On the other hand, in step S7, in case that the state flag is judged as "1", in other words, in case that it is judged the clock reproduction is carried out once, the state goes to step S10. In step S10, the variable range of the control information is detected according to a receiving interval obtained in step S4 and the specified frequency variable range. Then, in step S11, a maximum value of the obtained variable range is compared with the control information obtained in step S5.

In case that the maximum value of the variable range is larger than the control information, the maximum value of the variable range obtained in step S5 is determined as a control information.

In case that the maximum value within the variable range is equal to or smaller than the control information, the maximum value within the variable range is determined as a control information. Then, in step S6, the frequency is controlled using the control information determined in step S11. In this way, it is possible to limit the frequency variation within the specified range after once the clock reproduction is carried out once.

In case of judging whether the first clock reproduction is carried out in step S8, it is judged whether the change of the clock information difference or the frequency difference Δf is "0" or not. However, it is also possible to judge whether the change of the clock information difference or the frequency difference Δf is within a predetermined small range.

Embodiment 5

In the above fourth embodiment, a voltage-controlled oscillator is used as a reproduced clock output device. In this case, a controller 4 controls the oscillator 1 by the voltage. In other words, the controller 4 generates and outputs a control voltage so that the frequency difference Δf obtained by the formula (1) decreases, for example. In order to generate this control voltage, a characteristic of the output frequency against the control voltage is used. However, since such a characteristic of the voltage-controlled oscillator includes dispersion within a certain range, it is necessary to actually measure the characteristic for each voltage-controlled oscillator to obtain an accurate characteristic.

In a fifth embodiment, the frequency change caused by the frequency control is detected over the plurality of controls. According to the result of the plurality of detections, the characteristic of the reproduced clock output device is obtained, and the output voltage of the controller 4 is corrected. Accordingly, the above mentioned arrangement is not necessary in the fifth embodiment.

A block diagram of the fifth embodiment is the same as those shown in the first to fourth embodiments. In this fifth embodiment, for example, an operation to generate the control information described in a step S5 in FIG. 2 is embodied as follows.

First, for example, when (k−1)-th transmitting information 100 is received, a frequency difference $\Delta f_{k-1}$ calculated by the formula (1) is stored, and a control signal 104 which varies the reproduced clock frequency of an oscillator 1 by the frequency difference $\Delta f_{k-1}$ is generated based on a characteristic of the oscillator 1. This control voltage is provided to the oscillator 1 to control the oscillator 1.

Next, when k-th transmitting clock information 100 is received, if the reproduced clock frequency of the oscillator 1 is changed by the frequency difference $\Delta f_{k-1}$ according to the control voltage 104 based on the frequency difference $\Delta f_{k-1}$, the frequency difference $\Delta f_k$ becomes "0". However, if the relationship between the control voltage and the reproduced clock frequency in the oscillator 1 is different from the characteristic of the oscillator shown in a catalog, the frequency difference $\Delta f_k$ is not equal to "0".

In the above case, a correction coefficient $G_k$, which corrects the characteristic of the oscillator 1 shown in the catalog to the actual characteristic, is obtained using a following formula (2) according to the frequency difference $\Delta f_{k-1}$ and the frequency difference $\Delta f_k$.

$$G_k = 1 - (\Delta f_k / \Delta f_{k-1}) \quad (2)$$

Where, $G_k$: the correction coefficient which corrects the characteristic shown in the catalog to the actual characteristic, $\Delta f_k$: a frequency difference when the k-th transmitting clock information is received.

The control voltage at a time of the frequency difference $\Delta f_{k-1}$ is corrected using above mentioned $G_k$ and outputted to the oscillator 1. Thereby, the reproduced clock frequency of the oscillator 1 is changed by the frequency difference $\Delta f_{k-1}$ and corresponding control voltage to the changed reproduced clock frequency is applied to the oscillator 1. Therefore, the desired frequency control is carried out.

Figure 8:
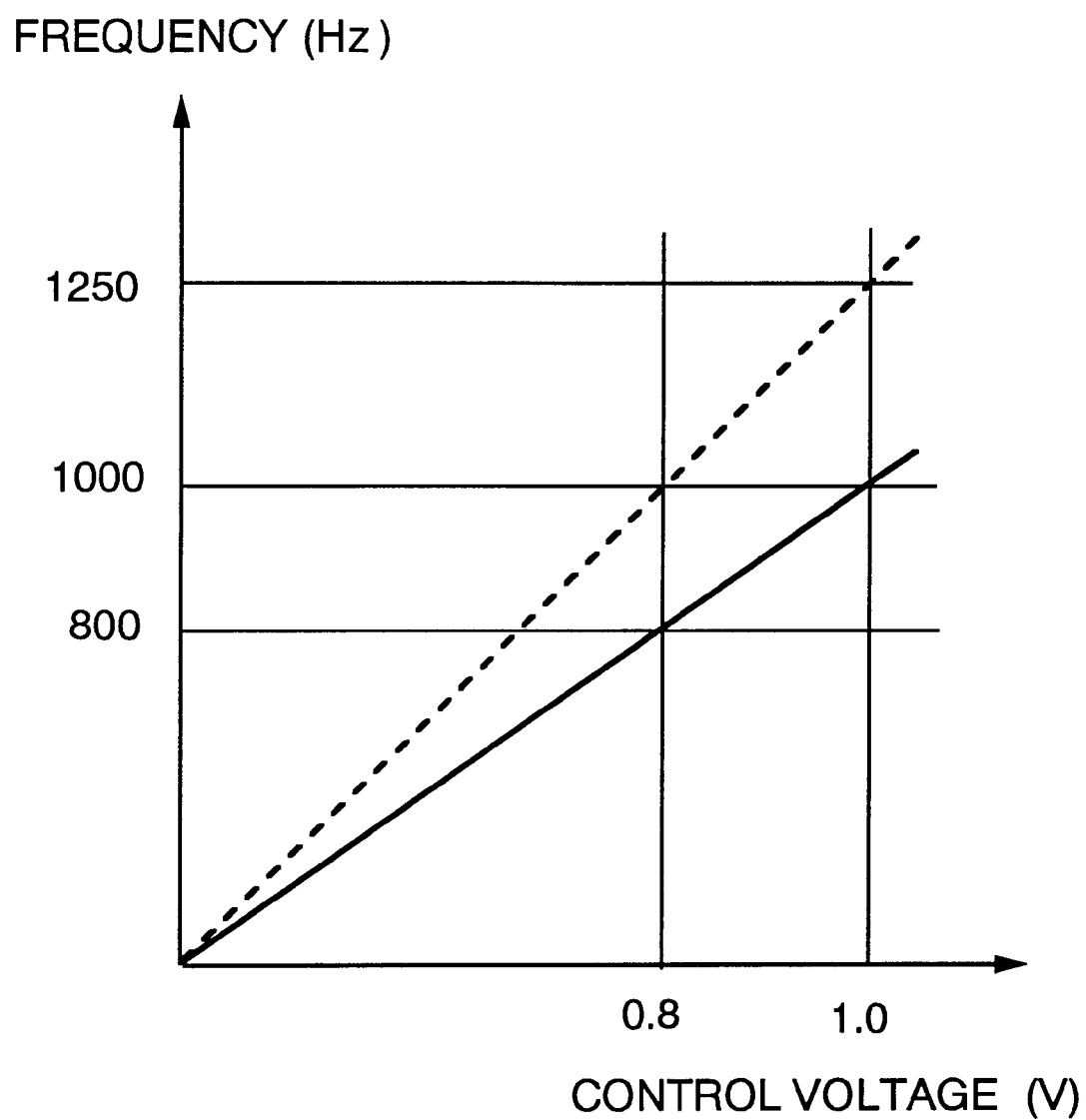
FIG. 8 is a relation between the control voltage and the frequency change of a fifth embodiment of the present invention.

A concrete example for the frequency correction is explained below. FIG. 8 is a relation between the control voltage and the frequency change of a fifth embodiment of the present invention. In FIG. 8, the horizontal axis shows a control voltage outputted from the low-pass filter/gain device 14 and the vertical axis shows a frequency outputted from the voltage-controlled oscillator 11. The solid line indicates a catalog value and the dotted line indicates a measured value. Assuming that the frequency is 1000 Hz at a control voltage of 1 V, and the frequency is 800 Hz at a control voltage of 0.8 V in case of the catalog value, and the frequency is 1250 Hz at a control voltage of 1 V, and the frequency is 1000 Hz at a control voltage of 0.8 V in case of the measured value. That is, assuming that the measured value is larger than the catalog value by 1.25 times.

If the frequency $\Delta f_{k-1}$ calculated by the formula (1) is 1000 Hz, the low-pass filter/gain device 14 outputs an output voltage of 1 V according to the solid line shown in FIG. 8. However, the voltage-controlled oscillator 11 outputs 1250 Hz according to the dotted line shown in FIG. 8. Accordingly, the next frequency $\Delta f_k$ is calculated such as $\Delta f_k = 1000 - 1250 = -250$. By substituting the above $\Delta f_{k-1}$ and $\Delta f_k$ to the formula (2), the correction coefficient $G_k = 1 - (\Delta f_{k-1}/\Delta f_k) = 1 - (-250/1000) = 1.25$. Therefore, the corrected frequency $\Delta f_{k-1}'$ becomes $\Delta f_{k-1}' = \Delta f_{k-1}/G_k = 1000/1.25 = 800$ Hz. That is, the low-pass filter/gain device 14 outputs 0.8 V in correspondence to the 800 Hz. The voltage-controlled oscillator 11 outputs 1000 Hz in correspondence to the 0.8 V.

As described above, in this correction, the frequency difference for controlling the oscillator 1 is obtained by dividing the frequency difference $\Delta f_{k-1}$ by $G_k$. The control voltage is generated according to the characteristic of the oscillator 1 shown in the catalog using the above frequency difference.

The correction can be carried out according to the control voltage which is finally outputted. That is, the correction can be carried out by correcting the frequency difference in advance as mentioned above, or the correction can be carried out using the correction coefficient for the generation processing (converting process from the frequency difference to the control voltage) at the time when the control voltage is generated from the frequency difference. It is also possible to make the correction after generating the control voltage. As described above, the correction process can be carried out using a factor other than the frequency difference.

This correction coefficient $G_k$ can be calculated and updated regularly or irregularly. As explained above, by detecting the relationship between the control voltage and the output frequency of the voltage-controlled oscillator by a real time basis, the adjustment of the voltage-controlled oscillator can be eliminated.

Figure 9:
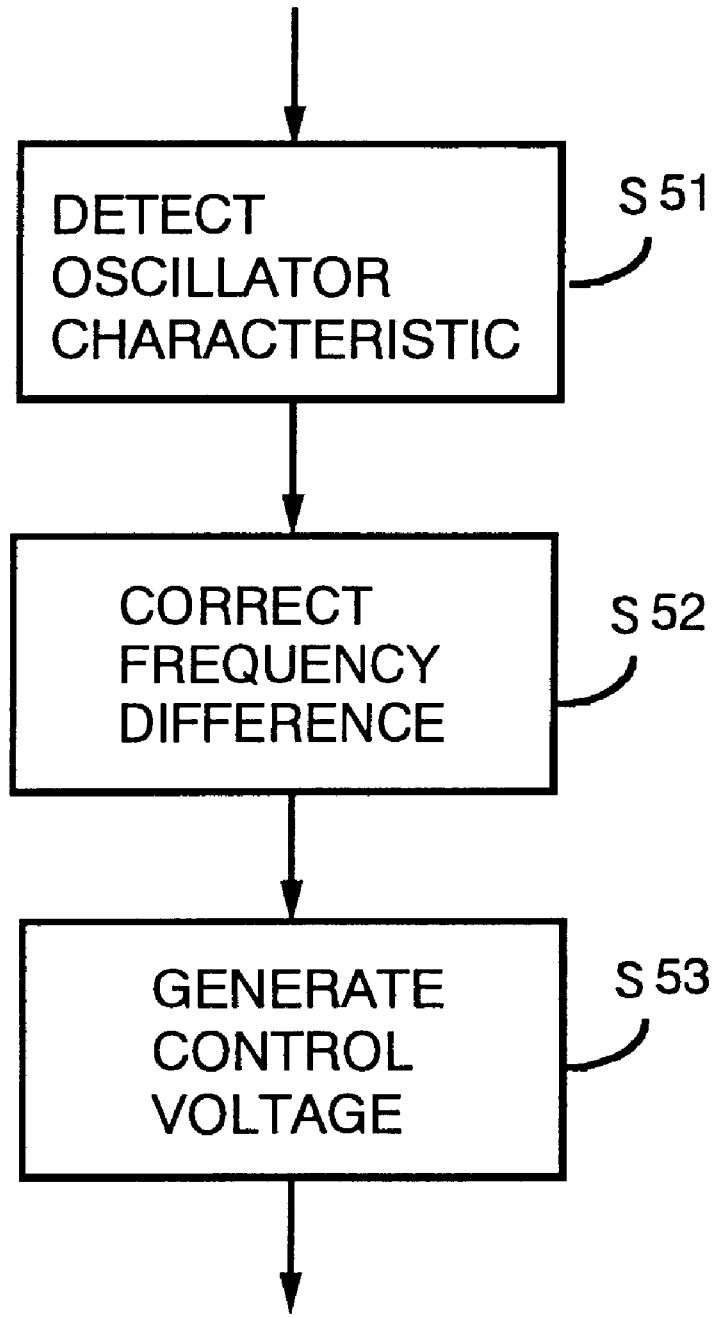
FIG. 9 is a flow chart showing a clock reproducing operation of the fifth embodiment of the present invention.

FIG. 9 is a flow chart showing the above mentioned operation of the fifth embodiment. FIG. 9 shows a part of the step S5 shown in the flow chart of FIG. 2. In step S51, the characteristic of the oscillator 1 is detected, and the frequency difference is corrected according to the characteristic detected in step S52, then in step S53, the control voltage is generated according to characteristic shown in the catalog using the corrected frequency difference.

Embodiment 6

In the above-mentioned embodiments, the constant difference between the transmitting clock information and the reproduced clock information indicates that the frequencies between the transmitting side and the receiving side are the same. Therefore, in the above-mentioned embodiments, the difference is controlled to be constant. In case of a device for transmitting and receiving the data and processing the data according to the transmitting clock information and the reproduced clock information, it is necessary to store the data corresponding the period for the difference in the receiver. If the difference is large, a large buffer for storing this data is necessary, and thus the size of the hardware increases.

In the sixth embodiment, the difference is eliminated by making the transmitting clock information and the reproduced clock information identical to each other as explained below. A block construction of the sixth embodiment is the same as those shown in the above-mentioned first to fifth embodiments. A generating operation of the control information in a controller 4 is explained below.

As explained in the first embodiment, a value of transmitting clock information 100 is loaded in a counter 2 when the transmitting clock information 100 is received for the first time. At this moment, the transmitting clock information 100 is identical with the reproduced clock information 101. In other words, there is no difference between the clock information between the transmitting side and the receiving side, and therefore an off-set value is "0". Since the frequencies of the transmitting side and the receiving side are the same at this moment, the slope of the count value (reproduced clock information) of the counter 2 and the slope of the transmitting clock information 100 are the same, and therefore, the off-set value remains "0". If this state continues, it is not necessary to increase the buffer capacity for storing a picture data in comparison with the off-set value on the receiving side, when a picture is displayed at a time when the reproduced clock information becomes identical with the transmitting clock information 100, in the data processing using the transmitting clock information 100 and the reproduced clock information 101, for example, in the picture data communication.

Figure 10:
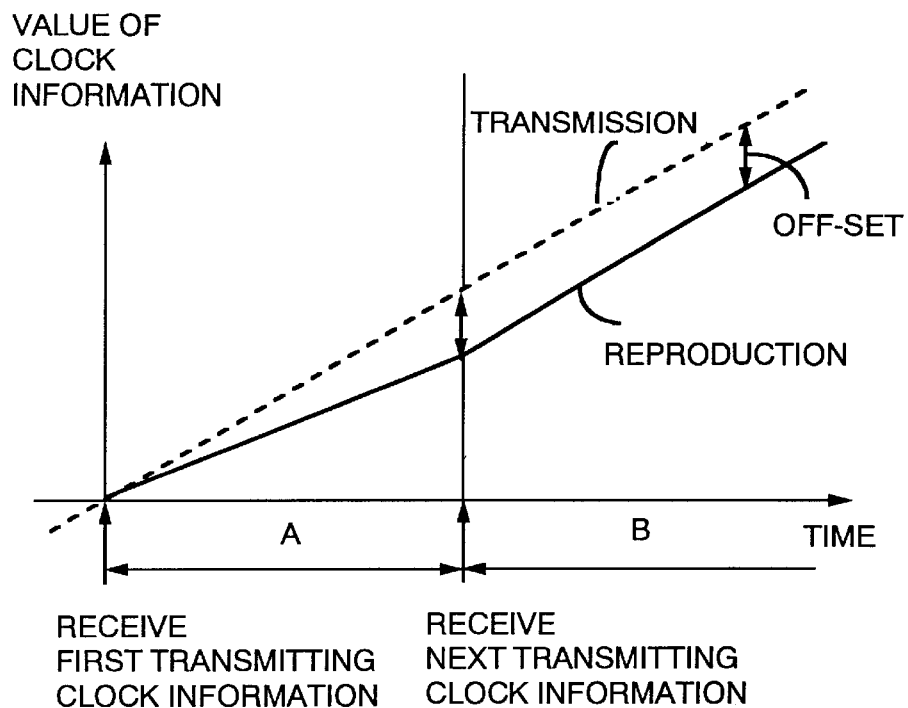
FIGS. 10A and 10B are diagrams to explain an example of a frequency control of a sixth embodiment of the present invention.
Figure 10:
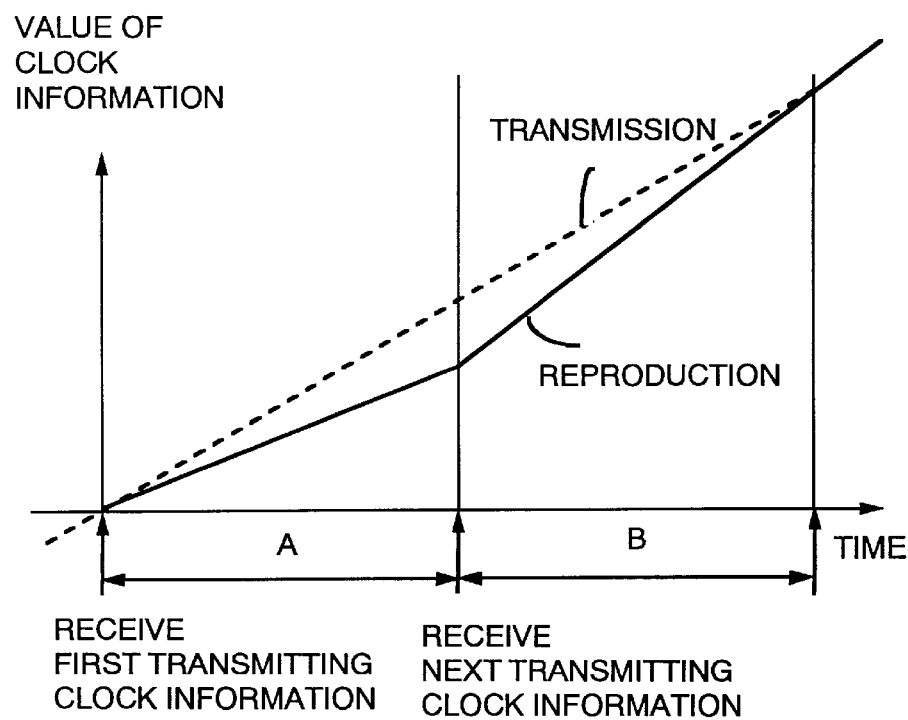
Figure 11:
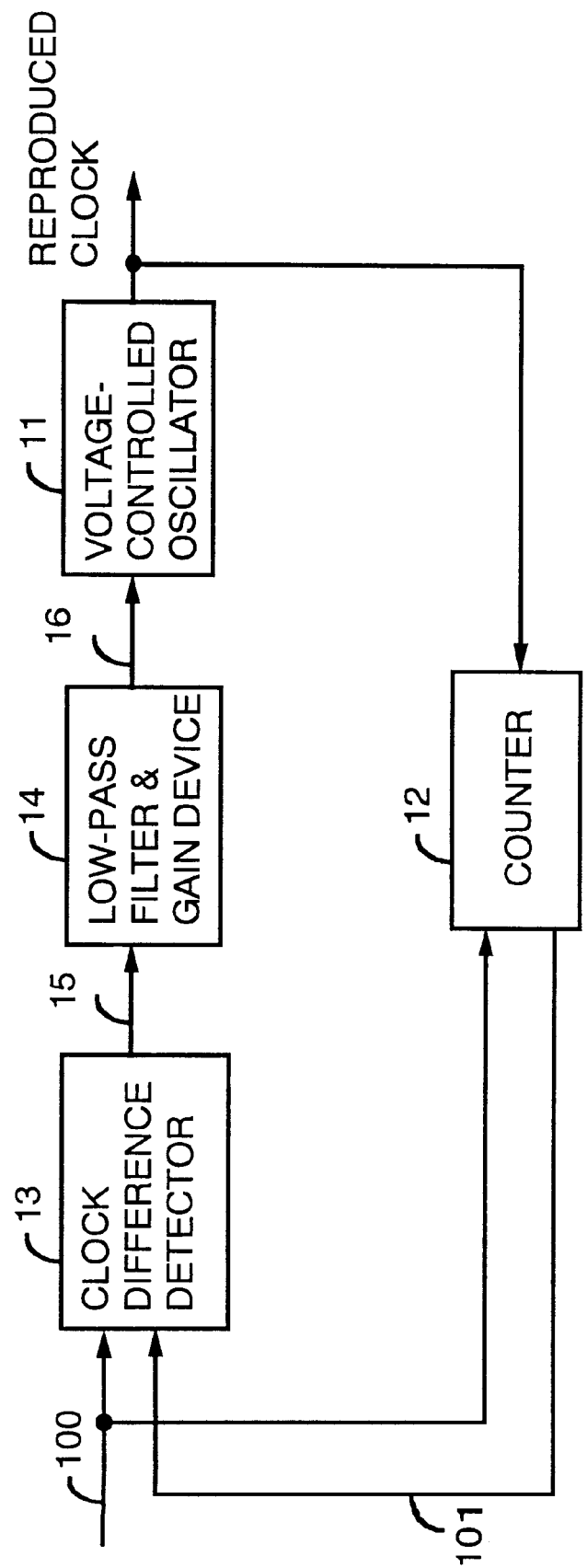
FIG. 11 is a block diagram showing a conventional clock reproducing device.

However, the transmitting clock frequency is rarely identical with the reproduced clock frequency from the beginning, and therefore the transmitting clock information 100 and the reproduced clock information 101 gradually separate from each other. For example, in case that the transmitting clock frequency is higher than the reproduced clock frequency, the transmitting clock information 100 gradually increases than the reproduced clock information 101. A period A in FIG. 10A shows this state.

When the next transmitting clock information 100 is received, the frequency difference Δf is obtained using the formula (1). As explained in the first embodiment, a control signal 104 is generated so that the frequency difference Δf is canceled, or the reproduced clock frequency is increased by the frequency difference Δf in this example, which makes the two frequencies identical to each other. If the frequencies are controlled to be identical to each other as explained above, the count value of the counter 2 increases at the same rate as the transmitting clock information 100 after the time. Therefore, the difference (off-set value) between the transmitting clock information 100 and the reproduced clock information 101 becomes constant as shown in a period B in FIG. 10A. This constant off-set value corresponds to the difference which occurs from the reception time of the first transmitting clock information 100 to the reception time of the next transmitting clock information 100.

Since it is not preferable that the off-set value is large as explained above, the control signal 104 is generated so that the reproduced clock frequency is increased by 2×Δf, but not by Δf in this embodiment, when the next transmitting clock information 100 is received.

Then, the reproduced clock frequency is higher than the transmitting clock frequency, and the count value (reproduced clock information) of the counter 2 increases at a greater rate. Accordingly the reproduced clock frequency approaches transmitting clock frequency, and the off-set value decreases. FIG. 10B shows this state.

Ideally, the off-set value becomes "0" at the end of the period B, which is as same as the period A from the reception of the next transmitting clock information 100. At this point, the control signal 104 is changed to a value, which cancels the frequency difference Δf, obtained using the formula (1) as in the first embodiment. Thereby, the transmitting clock frequency becomes identical with the reproduced clock frequency, and the off-set value becomes substantially "0". Therefore, it is possible to decrease the size of the data buffer of the receiver.

In the case explained above, the controlled frequency is temporarily corrected by 2×Δf. But, the controlled frequency is not limited to this value. Anyway, the reproduced clock frequency of the reproduced clock output device is controlled in a range larger than the frequency difference Δf, and the time when the frequencies become identical to each other is determined depending on this controlling range. For example, if the frequency is temporarily changed by 3×Δf, the period B is half of the period A.

In the case explained above, the period B is obtained according to the period A. However, it is also possible to detect and use the transmitting clock information 100 for this control if the transmitting clock information 100 is periodically transmitted. In case of FIG. 10B, for example, the end of the period B can be substituted by the reception time of the third transmitting clock information 100.

In the case explained above, the reproduced clock frequency is smaller than the transmitting clock frequency at first. But, in case the reproduced clock frequency is larger than the transmitting clock frequency, the control is carried out in the same way if the reproducing clock frequency is controlled in the reverse direction.

In the case explained above, the off-set value is controlled so that it is canceled soon after the received reproduced clock information is loaded in the counter 2. But, the off-set value can be controlled so that it is canceled after the frequencies on the transmitting side and the receiving side become the same and also the off-set value is held as explained in the first embodiment. In the case explained above, since the reproduced clock information is loaded in the counter 2 from the beginning, the count values of the transmitting side and the receiving side become identical to each other. Therefore, the range for controlling the frequency and the time is obtained relatively easily as explained above. In this stable state, it is necessary to calculate the difference between the count value of the counter 2 and the transmitting clock information 100, and also to calculate the frequency controlling range and the controlling time in order to cancel this difference.

The invention being thus described, it will be obvious that the same may be varied in many ways. Such variations are no to be regarded as a departure from the spirit and scope of the invention, and all such modifications as would be obvious to one skilled in the art are intended to be included within the scope of the following claims.

What is claimed is:

1. A clock reproducing device comprising:
   reproduced clock output means for outputting reproduced clock information;
   clock difference detecting means for detecting a difference between transmitting clock information received from a transmitting side and the reproduced clock information indicating a reproduced clock frequency output from said reproduced clock output means;
   receiving interval output means for detecting and outputting a receiving interval of said transmitting clock information; and
   control means for controlling the reproduced clock frequency of said reproduced clock output means according to the receiving interval from said receiving interval output means and the difference from said clock difference detecting means.

2. The clock reproducing device of claim 1, wherein said receiving interval output means includes:
   detecting means for detecting each interval of a plurality of transmitting clock information;
   receiving interval setting means for setting a desired receiving interval threshold value; and
   output means for outputting the receiving interval according to a comparison result between the receiving interval threshold value set by said receiving interval setting means and each receiving interval detected by said detecting means.

3. The clock reproducing device of claim 2, wherein said receiving interval setting means sets the receiving interval threshold value according to the difference obtained by said clock difference detecting means.

4. The clock reproducing device of claim 1, wherein said control means sets a control variable range of the reproduced clock frequency outputted from said reproduced clock output means according to said difference obtained by the clock difference detecting means.

5. The clock reproducing device of claim 3, wherein said control means sets a control variable range of the reproduced clock frequency outputted from said reproduced clock output means according to the difference obtained by said clock difference detecting means.

6. The clock reproducing device of claim 3, wherein
   said control means calculates a frequency difference between a transmitting side clock frequency and the reproduced clock frequency according to the receiving interval information from said receiving interval output means and the difference information from said clock difference detecting means, generates a control signal for controlling the reproduced clock frequency outputted from said reproduced clock output means according to the frequency difference, and corrects the generated control signal according to the frequency difference obtained at a plurality of different times.

7. The clock reproducing device of claim 3, wherein
   said control means calculates the frequency difference between a transmitting side clock frequency and the reproduced clock frequency according to the receiving interval information from said receiving interval output means and the difference from said clock difference detecting means, and controls the reproduced clock frequency outputted from said reproduced clock output means by a larger control range than the frequency difference.

8. A clock reproducing method comprising steps of:
   detecting a receiving interval of transmitting clock information indicating a transmitting side clock frequency;
   detecting a difference between the received transmitting clock information and reception clock information indicating a reproduced clock frequency; and
   controlling the reproduced clock frequency according to the detected difference and the receiving interval.

9. The clock reproducing method of claim 8, further comprising the steps of:
   setting a desired receiving interval threshold value; and
   calculating a receiving interval information according to a comparison result between the receiving interval threshold value and the detected receiving interval.

10. The clock reproducing method of claim 9, further comprising the step of:
    setting the receiving interval threshold value according to the difference between the received transmitting clock information and the reception clock information.

11. The clock reproducing method of claim 8, further comprising the step of:
    setting a control variable range of the reproduced clock frequency according to the difference between the received transmitting clock information and the reception clock information.

12. The clock reproducing method of claim 9, further comprising the step of:
    setting a control variable range of the reproduced clock frequency according to the difference between the received transmitting clock information and the reception clock information.

13. The clock reproducing method of claim 9, further comprising the steps of:
    calculating a frequency difference between a transmitting side clock frequency and the reproduced clock frequency according to the receiving interval and the detected difference;
    generating control information for controlling the reproduced clock frequency according to the frequency difference; and
    correcting the generated control information according to the frequency difference obtained at a plurality of different times.

14. The clock reproducing method of claim 9, further comprising the steps of:
    calculating the frequency difference between a transmitting side clock frequency and the reproduced clock frequency according to the receiving interval information and the detected difference; and
    controlling the reproduced clock frequency by a larger control range than the frequency difference.

* * * * *